United States Patent
Kim et al.

(10) Patent No.: US 11,830,840 B2
(45) Date of Patent: Nov. 28, 2023

(54) INTEGRATED CHIP AND SEMICONDUCTOR PACKAGE INCLUDING THE SAME

(71) Applicant: Samsung Electronics Co., Ltd., Suwon-si (KR)

(72) Inventors: Young Jun Kim, Ansan-si (KR); Woon-Ki Lee, Yongin-si (KR); Jong Sun Jung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 188 days.

(21) Appl. No.: 17/175,119

(22) Filed: Feb. 12, 2021

(65) Prior Publication Data

US 2021/0407948 A1    Dec. 30, 2021

(30) Foreign Application Priority Data

Jun. 30, 2020    (KR) .................. 10-2020-0079970

(51) Int. Cl.
*H01L 23/00* (2006.01)
*H01L 23/58* (2006.01)

(52) U.S. Cl.
CPC ............ *H01L 24/14* (2013.01); *H01L 23/585* (2013.01); *H01L 24/16* (2013.01);
(Continued)

(58) Field of Classification Search
CPC ........ H01L 24/14; H01L 23/585; H01L 24/16
See application file for complete search history.

(56) References Cited

U.S. PATENT DOCUMENTS

| 6,727,597 | B2 | 4/2004 | Taylor et al. |
| 6,777,815 | B2 | 8/2004 | Huang |

(Continued)

FOREIGN PATENT DOCUMENTS

| JP | 2005326976 A | 11/2005 |
| JP | 2011066344 A | 3/2011 |

(Continued)

*Primary Examiner* — Trang Q Tran
(74) *Attorney, Agent, or Firm* — Muir Patent Law, PLLC

(57) ABSTRACT

An integrated circuit chip includes a substrate on which a standard cell is disposed. The integrated circuit chip includes a plurality of power bumps including a plurality of first power bumps and a plurality of second power bumps, the plurality of power bumps. disposed to have a staggered arrangement in a central region of one surface of the integrated circuit chip, and connected to provide power to the standard cell; a first metal wiring disposed below the plurality of first power bumps and electrically connected to the plurality of first power bumps, at least a part of the first metal wiring overlapping the plurality of first power bumps from a plan view; and a second metal wiring horizontally separated from the first metal wiring, disposed below the plurality of second power bumps, and electrically connected to the plurality of second power bumps, at least a part of the second metal wiring overlapping the plurality of second power bumps from the plan view. The plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip, and the plurality of second power bumps are disposed along a third line spaced apart from the first line and extending in the first direction, and along a fourth line spaced apart from the second line and extending in the second direction.

20 Claims, 11 Drawing Sheets

(52) U.S. Cl.
CPC ............ *H01L 2224/02381* (2013.01); *H01L 2224/14133* (2013.01); *H01L 2224/14135* (2013.01); *H01L 2224/14177* (2013.01); *H01L 2224/14515* (2013.01); *H01L 2224/16227* (2013.01)

(56) References Cited

U.S. PATENT DOCUMENTS

| | | |
|---|---|---|
| 7,037,820 B2 | 5/2006 | Booth et al. |
| 7,605,480 B2 | 10/2009 | Pendse |
| 8,247,906 B2 | 8/2012 | Law et al. |
| 8,549,460 B2 | 10/2013 | Law et al. |
| 8,772,928 B2 | 7/2014 | Lin et al. |
| 9,370,103 B2 | 6/2016 | Yun et al. |
| 2006/0175637 A1 | 8/2006 | Lee |
| 2019/0385941 A1* | 12/2019 | Lai .................... H01L 23/49827 |

FOREIGN PATENT DOCUMENTS

| | | |
|---|---|---|
| JP | 5322061 B2 | 10/2013 |
| JP | 5797534 B2 | 10/2015 |

\* cited by examiner

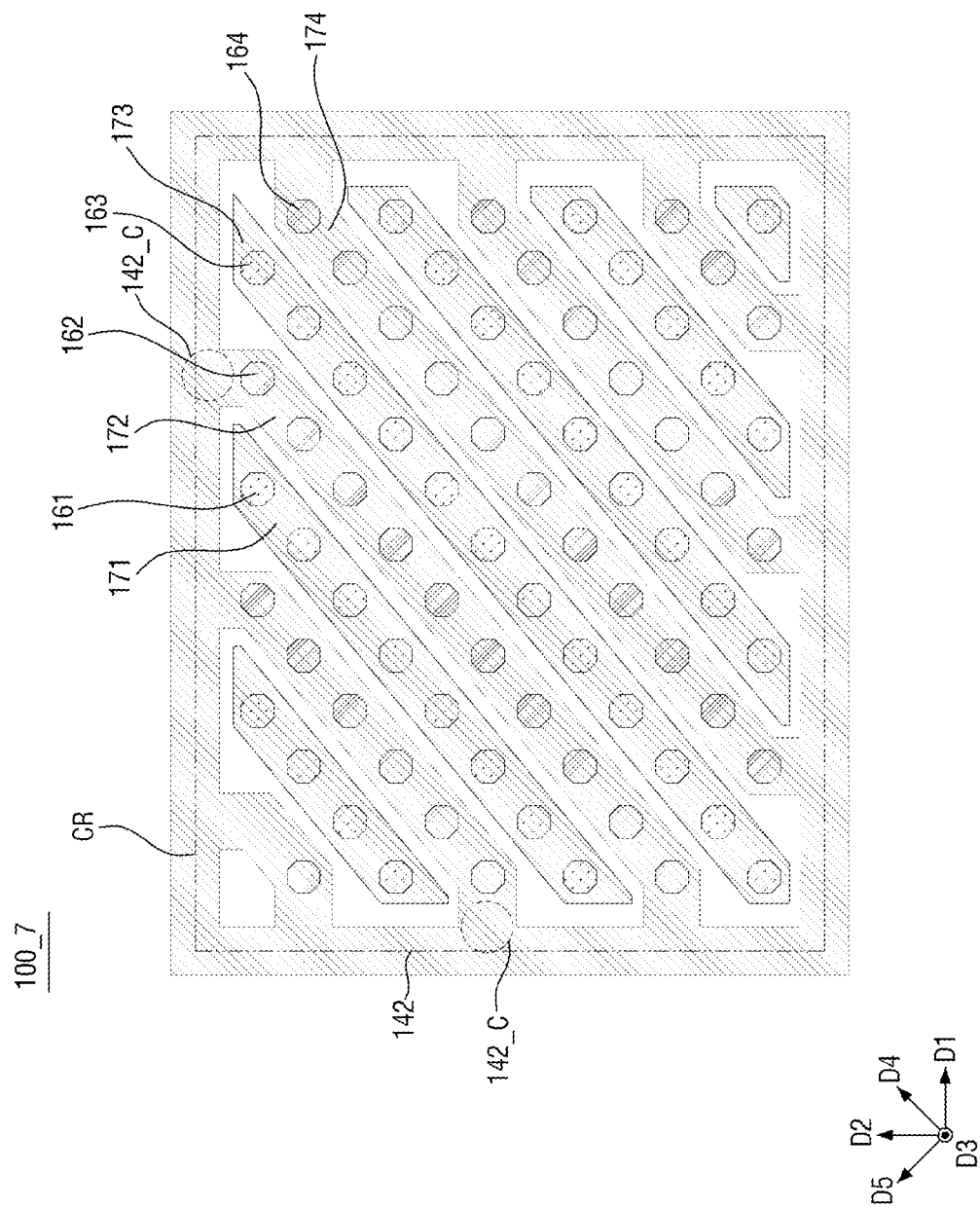

INTEGRATED CHIP AND SEMICONDUCTOR PACKAGE INCLUDING THE SAME

This application claims priority under 35 U.S.C. § 119 to Korean Patent Application No. 10-2020-0079970, filed on Jun. 30, 2020, the disclosure of which is incorporated herein by reference in its entirety.

BACKGROUND

1. Field of the Invention

The present invention relates to an integrated circuit chip and a semiconductor package including the same.

2. Explanation of the Related Art

In general, in order to drive an integrated circuit chip, it is necessary to properly supply and distribute power, and the number of power bumps serving as a power source of the integrated circuit chip is determined depending on the size of the integrated circuit chip and the number of signal bumps.

If the number of signal bumps is not large compared to the chip size, although there are no major problems in the power supply and distribution, the number of power bumps that may be placed in the same chip size decreases with the trend of an increase in the number of signal bumps. The reduced number of power bumps may lead to a deterioration of power integrity such as an IR-drop violation. Therefore, there is a need for a bump placement and redistribution (RDL) routing optimized for power integrity.

SUMMARY

Aspects of the present invention provide an integrated circuit chip in which power integrity is improved through the placement of power bumps in the form of fishbone shape.

Aspects of the present invention also provide a semiconductor package in which power integrity is improved through the placement of power bumps in the form of fishbone shape.

However, aspects of the present invention are not restricted to the ones set forth herein. The above and other aspects of the present invention will become more apparent to one of ordinary skill in the art to which the present invention pertains by referencing the detailed explanation of the present invention given below.

According to one embodiment, an integrated circuit chip includes a substrate on which a standard cell is disposed. The integrated circuit chip includes a plurality of power bumps including a plurality of first power bumps and a plurality of second power bumps, the plurality of power bumps. disposed to have a staggered arrangement in a central region of one surface of the integrated circuit chip, and connected to provide power to the standard cell; a first metal wiring disposed below the plurality of first power bumps and electrically connected to the plurality of first power bumps, at least a part of the first metal wiring overlapping the plurality of first power bumps from a plan view; and a second metal wiring horizontally separated from the first metal wiring, disposed below the plurality of second power bumps, and electrically connected to the plurality of second power bumps, at least a part of the second metal wiring overlapping the plurality of second power bumps from the plan view. The plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip, and the plurality of second power bumps are disposed along a third line spaced apart from the first line and extending in the first direction, and along a fourth line spaced apart from the second line and extending in the second direction.

According to one embodiment, which may be the same or a different embodiment as the embodiment mentioned previously, an integrated circuit chip includes a substrate on which a standard cell is disposed. The integrated circuit chip includes a plurality of power bumps including a plurality of first power bumps and a plurality of second power bumps, the plurality of power bumps disposed in a central region of one surface of the integrated circuit chip to have a staggered arrangement, and connected to provide power to the standard cell. The plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip. The plurality of second power bumps are disposed along a third line spaced apart from the first line and extending in the first direction, and along a fourth line spaced apart from the second line and extending in the second direction. The plurality of first power bumps are connected to an integrated circuit of the integrated circuit chip, so that when a first voltage is received from outside the integrated circuit chip, the first voltage is applied to the integrated circuit through the plurality of first power bumps, and the plurality of second power bumps are connected to the integrated circuit of the integrated circuit chip, so that when a second voltage different from the first voltage is received from outside the integrated circuit chip, the second voltage is applied to the integrated circuit through the plurality of second power bumps.

According to one embodiment, which may be the same or a different embodiment as the embodiments mentioned previously, a semiconductor package includes a package substrate including a first surface on which a plurality of external connection terminals are disposed, and a second surface opposite to the first surface, and an integrated circuit chip including a connection surface facing to the second surface of the package substrate, and including plurality of power bumps including a plurality of first power bumps and a plurality of second power bumps, the plurality of power bumps disposed on the connection surface to have a staggered arrangement. The plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip. The plurality of second power bumps are disposed along a third line different from the first line and extending in the first direction, and along a fourth line different from the second line and extending in the second direction. At least a first external connection terminal of the plurality of external connection terminals overlaps a set of power bumps of the plurality of first power bumps and does not overlap any power bumps of the plurality of second power bumps from a plan view.

BRIEF EXPLANATION OF THE DRAWINGS

The above and other aspects and features of the present invention will become more apparent by describing in detail exemplary embodiments thereof with reference to the attached drawings, in which:

FIG. 11 is a plan view for explaining an integrated circuit chip according to some other embodiments of the present invention.

DETAILED EXPLANATION OF THE EMBODIMENTS

Figure 1:
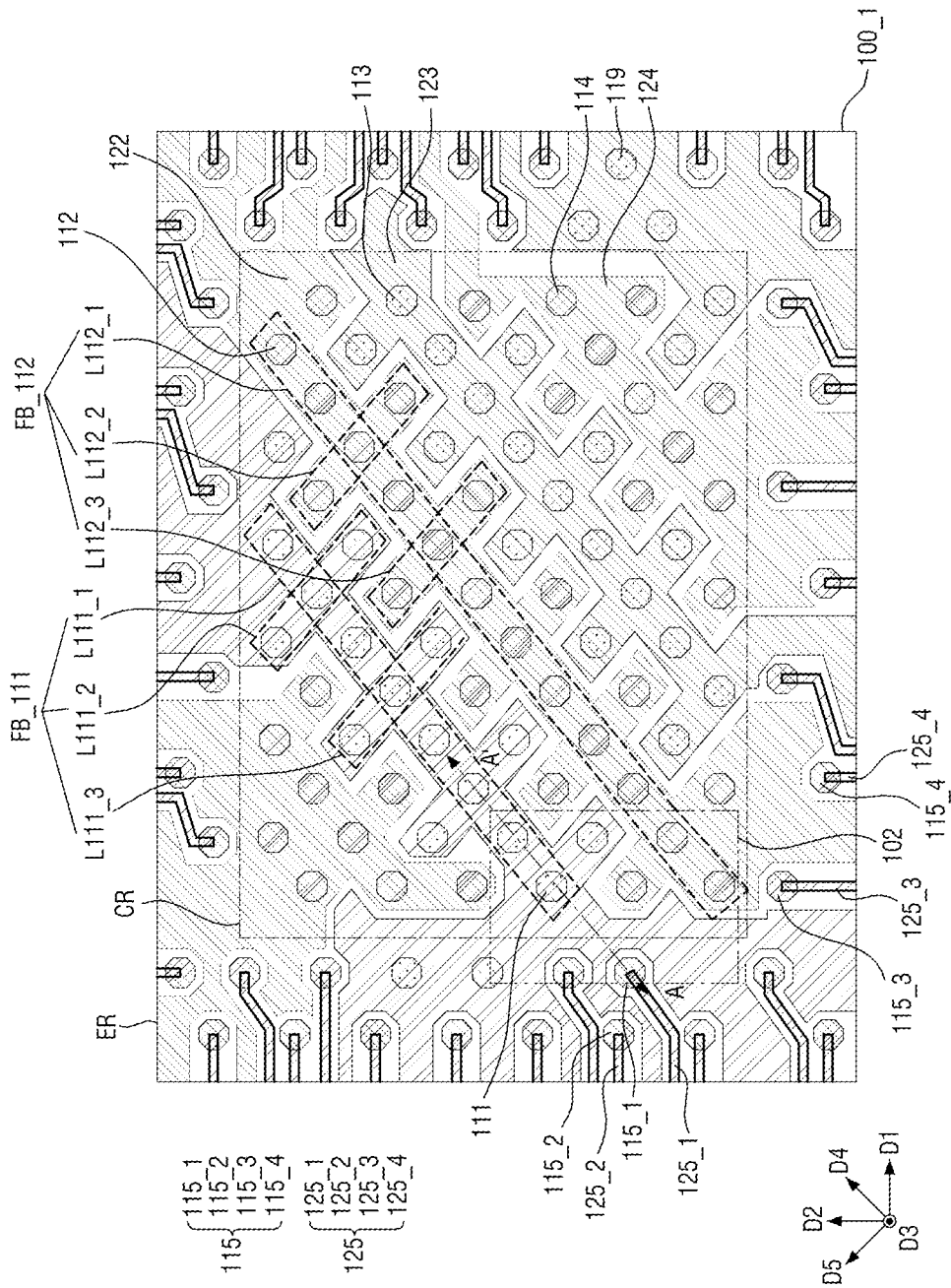
FIG. 1 is a plan view for explaining an integrated circuit chip according to some embodiments of the present invention.

Hereinafter, embodiments according to the technical idea of the present invention will be explained with reference to the accompanying drawings. In the explanation of FIGS. 1 to 11, the same reference numerals are used for substantially the same components, and the repeated explanation of the components will not be provided. Also, similar reference numerals are used for similar components throughout the several diagrams of the invention.

Figure 2:
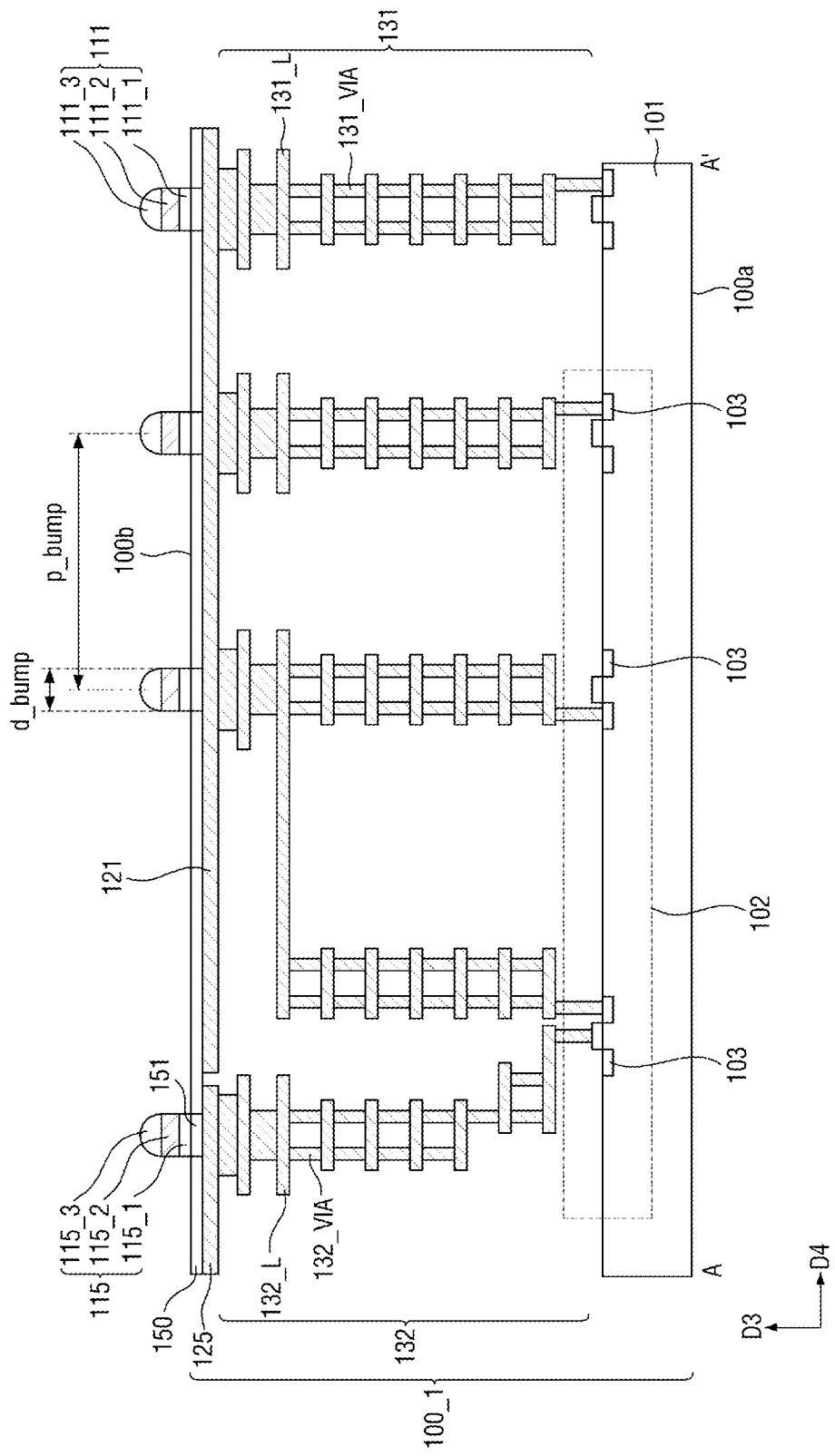
FIG. 2 is a cross-sectional view taken along a line A-A' of FIG. 1.

FIG. 1 is a plan view for explaining an integrated circuit chip according to some embodiments of the present invention. FIG. 2 is a cross-sectional view taken along the line A-A' of FIG. 1. FIG. 1 is a diagram showing power bumps/signal bumps placed on one side (e.g., one surface) of an integrated circuit chip, and uppermost metal wirings placed below the bumps and electrically connected thereto.

Referring to FIGS. 1 and 2, an integrated circuit chip 100_1 may include a front side 100a (e.g., front surface or front face) and a rear side 100b (e.g., back surface or back face) opposite to each other, and may include a substrate 101, a standard cell 102, first and second VDD power bumps 111 and 113, first and second VSS power bumps 112 and 114, signal bumps 115, an edge power bump 119, first to fifth uppermost metal wiring 121 to 125, a power routing wiring body 131, a signal routing wiring body 132, and a passivation layer 150.

The front side 100a of the integrated circuit chip 100_1 may include one side of the substrate 101, and may be an exposed side of the integrated circuit chip 100_1. The rear side 100b opposite to the front side 100a may include one side of the passivation layer 150. The first and second VDD power bumps 111 and 113, the first and second VSS power bumps 112 and 114, the signal bump 115 and the edge power bump 119 are placed on the rear side 100b. The rear side 100b may be a connection side (e.g., connection surface) which faces the integrate circuit chip 100_1 and electrically connects between the integrated circuit chip 100_1 and the package substrate when forming a package. A specific explanation of a region on the rear side 100b will be provided below together in the explanation of placement of the first and second VDD power bumps 111 and 113, the first and second VSS power bumps 112 and 114, the signal bump 115, and the edge power bump 119.

The substrate 101 may be bulk silicon or SOI (silicon-on-insulator). Alternatively, the substrate 101 may be a silicon substrate or may include, but is not limited to, other materials, for example, silicon germanium, SGOI (silicon germanium on insulator), indium antimonide, lead tellurium compounds, indium arsenide, phosphide indium, gallium arsenide or gallium antimonide.

The standard cell 102 may be placed on the substrate 101. The standard cell 102 may be, for example, but is not limited to, an inverter, a multiplexer (MUX), a buffer, a flip-flop, a latch and a logical operation block such as AND, OR, XOR, and NAND.

The standard cell 102 may include one or more transistors 103 having a channel length of 10 nm, 7 nm, or 5 nm or less. However, the aforementioned example of the channel length does not limit the technical idea of the present invention. Each transistor 103 may receive power and signals from each of the power routing wiring body 131 and the signal routing wiring body 132.

The first and second VDD power bumps 111 and 113, the first and second VSS power bumps 112 and 114, the signal bump 115, and the edge power bump 119 may all have an octagonal shape from a planar viewpoint, but the shape is not limited thereto, and they may have a shape such as a pentagon or a circle.

The first and second VDD power bumps 111 and 113, the first and second VSS power bumps 112 and 114, the signal bump 115, and the edge power bump 119 may each include an under bump metal, a pillar, and a solder. In certain embodiments, each of the first and second VDD power bumps 111 and 113, the signal bump 115, and the edge power bump 119 includes the same and corresponding configuration, and explanation thereof may be replaced with the explanation of the first VDD power bump 111.

A first VDD power bump 111 may include a first under bump metal 111_1, a first pillar 111_2, and a first solder 111_3. The first under bump metal 111_1 may include titanium (Ti), nickel (Ni), or the like. However, the first under bump metal 111_1 is not limited to the aforementioned example of the materials, and the first under bump metal 111_1 is placed on a connection pad 151 surrounded by the passivation layer 150, and mediates a connection between the integrated circuit chip 100_1 and the first pillar 111_2. The connection pad 151 may be formed to have a surface that is coplanar with an outer surface of passivation layer 150. The first under bump metal 111_1 may have a first surface that contacts the surface of the connection pad 151 that is coplanar with the outer surface of the passivation layer 150, and a second surface opposite the first surface. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first pillar 111_2 may be placed on an upper side (e.g., second surface) of the first under bump metal 111_1. Therefore, the integrated circuit chip 100_1 may be electrically connected to a pad of a package substrate, a pad of the interposer layer or a pad of another chip through the first pillar 111_2.

Although the first pillar 111_2 may include at least one of tin (Sn), tin alloy (Sn—Bi, Sn—Ag, Sn—Cu, Sn—Ag, and Sn—Ag—Cu), indium (In), lead (Pb), zinc (Zn), nickel (Ni), gold (Au), silver (Ag), copper (Cu), antimony (Sb), bismuth (Bi), and combinations thereof, the technical idea of the present invention is not limited thereto. The first pillar 111_2 may have a flat top and bottom surface, wherein the bottom surface contacts the second surface of the first under bump metal 111_1 and the top surface is opposite the bottom surface and contacts the first solder 111_3.

Since the first VDD power bump 111 includes the first solder 111_3, even if a solder is not formed on a contact face of the package substrate when being connected to the package substrate, the first pillar 111_2 may be connected to the contact face of the package substrate.

A bump diameter d_bump of the first VDD power bump 111 according to some embodiments is in the range of 44 um to 96 um, and the same also applies to the second VDD power bump 113, the first and second VSS power bumps 112 and 114, the signal bump 115, and the edge power bump 119.

The first and second VDD power bumps 111 and 113 and first and second VSS power bumps 112 and 114 may be connected to components of an integrated circuit within the integrated circuit chip 100_1 that operate by receiving a power (e.g., VDD and VSS) from outside of the integrated circuit chip 100_1. For example, these components may receive a constant power voltage, applied from outside the integrated circuit chip 100_1, and transmitted through the first and second VDD power bumps 111 and 113 and the first and second VSS power bumps 112 and 114. Therefore, the first and second VDD power bumps 111 and 113 and the first and second VSS power bumps 112 and 114 are connected to provide power to the integrated circuit chip 100_1 (e.g., to one or more standard cells of the integrated circuit chip 100_1).

The first and second VDD power bumps 111 and 113 and the first and second VSS power bumps 112 and 114 are placed on a central region CR of the rear side 100b of the integrated circuit chip 100_1. The signal bumps 115 and the edge power bumps 119 may be placed in an edge region ER other than the central region CR of the rear side 100b of the integrated circuit chip 100_1. The number of edge power bumps 119 placed on the edge region ER may be smaller than the signal bumps 115 placed on the edge region ER. The edge region ER surrounds the central region CR and includes bumps adjacent to edges of the integrated circuit chip 100_1.

The signal bumps 115 may be connected to components of an integrated circuit within the integrated circuit chip 100_1 that operate by receiving signals, such as data, command, and/or address signals, from outside of the integrated circuit chip 100_1. For example, these components may receive a signal having a wave form shape with alternating high and low voltages, applied from outside the integrated circuit chip 100_1, and transmitted through signal bumps.

The first and second VDD power bumps 111 and 113, and the first and second VSS power bumps 112 and 114 according to some embodiments may be placed in a staggered arrangement and may be placed in a staggered form on the central region CR. As used herein, the term "staggered arrangement" is used to mean that any two components closest to each other among the components forming the first and second VDD power bumps 111 and 113 and the first and second VSS power bumps 112 and 114 are not placed on a straight line along a first direction D1 in which one side wall of the integrated circuit chip 100_1 extends or a second direction D2 in which the other side wall being in contact with one side wall of the integrated circuit chip 100_1 extends, but one component is diagonally shifted with respect to the other component. For example, the first VDD power bump 111 and the second VSS power bump 112 that are closest to each other are not placed on a straight line along the first direction D1, but may be placed along a first diagonal direction D4 or a second diagonal direction D5, which are diagonal directions to the first direction D1 and the second direction D2. The angle of the first diagonal direction D4 or the second diagonal direction D5 according to some embodiments may be 45° or 135° on the basis of the first direction D1, respectively. Stated differently, in the central region CR, power bumps may be arranged in rows extending in the D1 direction, which rows may be adjacent to each other in the D2 direction. For two directly adjacent rows, no power bumps are aligned with any other power bumps in the D2 direction from among the two directly adjacent rows. Rather, for the two adjacent rows, power bumps may form a zig-zag shape, and the two rows may have alternately arranged power bumps along the D1 direction.

A bump pitch p_bump which is a distance between the first and second VDD power bumps 111 and 113, between the first and second VSS power bumps 112 and 114, and between the signal bump 115 and the edge power bump 119 adjacent to each other according to some embodiments may have a value in the range of 90 um to 180 um.

The first VDD power bumps 111 may include a first line group L111_1 placed to extend in the first diagonal direction D4 of the integrated circuit chip 100_1, a second line group L111_2 placed to extend in the second diagonal direction D5 of the integrated circuit chip 100_1, and a third line group L111_3 placed to extend in the second diagonal direction D5 of the integrated circuit chip 100_1.

The second line group L111_2 and the third line group L111_3 extend in the second diagonal direction D5 to be parallel to each other, and at least one configuration of the first VDD power bumps 111 included in the first line group L111_1 may be placed between the second line group L111_2 and the third line group L111_3. Accordingly, at least a part of the first VDD power bump 111 may include a first fishbone group FB_111 placed in the form of a fishbone including the first line group L111_1 to the third line group L111_3. The group FB_111 may also be described as a football lacing group, forming the plan view shape of a lacing on a football.

A first VSS power bump 112 may include a fourth line group L112_1 placed to extend in the first diagonal direction D4 of the integrated circuit chip 100_1, a fifth line group L112_2 placed to extend in the second diagonal direction D5 of the integrated circuit chip 100_1, and a sixth line group L112_3 placed to extend in the second diagonal direction D5 of the integrated circuit chip 100_1. Ordinal numbers such as "first," "second," "third," etc., may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The fifth line group L112_2 and the sixth line group L112_6 extend in the second diagonal direction D5 to be parallel to each other, and at least one configuration of the first VSS power bumps 112 included in the fourth line group L112_1 may be placed between the fifth line group L112_2 and the sixth line group L112_3. Accordingly, at least a part of the first VSS power bumps 112 may include a first VSS fishbone group FB_112 placed in the form of a fishbone including the fourth line group L112_1 to the sixth line group L112_3. The second diagonal direction D5 may be perpendicular to the first diagonal direction D4, but the embodiments are not limited as such, and the first diagonal direction D4 may cross the second diagonal direction D5 to form a fishbone shape or football lacing shape at an angle other than 90°.

Second VDD power bumps 113 and second VSS power bumps 114 may be placed in the central region CR, and as in the first VDD power bumps 111 and the first VSS power bumps 112, each of at least a part of the second VDD power bumps 113 and at least a part of the second VSS power bumps 114 may include a second VDD fishbone group and a second VSS fishbone group placed in the form of a fishbone, or football lacing. As shown in FIG. 2, in at least one embodiment, adjacent fishbone groups overlap each other in a lengthwise-extending direction of the fishbone groups (e.g., in a direction D4). An item, layer, or portion of an item or layer described as extending "lengthwise" in a particular direction has a length in the particular direction and a width perpendicular to that direction, where the length is greater than the width. The first line group L111_1 and the fourth line group L112_1 may each include a row of power bumps extending in a diagonal direction (in relation to edges of the integrated circuit chip 100_1), such as the D4 direction. These two groups may be referred to as a spine, or a spine group, of the power bumps. The second line group L111_2, third line group L111_3, fifth line group L112_2, and sixth line group L112_3 each cross a respective spine group, and may each be referred to as a rib group.

A first uppermost metal wiring 121 is placed below the first VDD power bumps 111 within the central region CR, and may be electrically connected to a plurality of first VDD power bumps 111 in the form of one metal body. For example, the first uppermost metal wiring 121 combined with the first VDD power bumps 111 may be considered a single conductive structure, or one metal body. In addition, the first uppermost metal wiring 121 may have the form of a single continuous metal plate.

As will be explained below, the first uppermost metal wiring 121 may be placed between a fifth_1 uppermost metal wiring 125_1 and a fifth_2 uppermost metal wiring 125_2, and may extend from the center region CR to the edge region ER. Also, the first uppermost metal wiring 121 may be placed below the edge power bump 119, and may be electrically connected to the edge power bump 119.

A second uppermost metal wiring 122 may be placed below the first VSS power bumps 112 within the central region CR, and may be electrically connected to a plurality of first VSS power bumps 112 in the form of one metal body. For example, the second uppermost metal wiring 122 combined with the first VSS power bumps 112 may be considered a single conductive structure, or one metal body. In addition, the second uppermost metal wiring 122 may have the form of a single continuous metal plate.

As will be explained below, a second uppermost metal wiring 122 is placed between a fifth_3 uppermost metal wiring 125_3 and a fifth_4 uppermost metal wiring 125_4, and may extend from the central region CR to the edge region ER. Although not shown, the second uppermost metal wiring 122 may be placed below a power bump within the edge region ER and the central region CR may be electrically connected to the power bump.

A third uppermost metal wiring 123 is placed below the second VDD power bumps 113 within the central region CR, and may be electrically connected to a plurality of second VDD power bumps 113 in the form of one metal body. For example, the third uppermost metal wiring 123 combined with the second VDD power bumps 113 may be considered a single conductive structure, or one metal body. In addition, the third uppermost metal wiring 123 may have the form of a single continuous metal plate. The third uppermost metal wiring 123 is placed between the fifth uppermost metal wirings 125 and may extend to the edge region ER away from the central region CR.

A fourth uppermost metal wiring 124 is placed below the second VSS power bumps 114 within the central region CR, and may be electrically connected to a plurality of second VSS power bumps 114 in the form of one metal body. For example, the fourth uppermost metal wiring 124 combined with the second VSS power bumps 114 may be considered a single conductive structure, or one metal body. In addition, the fourth uppermost metal wiring 124 may have the form of a single continuous metal plate. The fourth uppermost metal wiring 124 may be placed between the fifth uppermost metal wirings 125 and extend to the edge region ER away from the central region CR.

A fifth uppermost metal wiring 125 includes fifth_1 to fifth_4 uppermost metal wirings 125_1 to 125_4, which are placed below each of the first to fourth signal bumps 115_1 to 115_4 included in the signal bump 115, are electrically connected to the signal bumps 115, and may extend toward I/O (input/output) terminals (not shown) from the signal bumps 115. The form of the I/O terminal (not shown) varies depending on the package form (e.g., Fan-in, and Fan-out) that includes the integrated circuit chip 100_1, and the form of the I/O terminal does not limit the technical idea of the present invention.

The first to fifth uppermost metal wirings 121 to 125 according to some embodiments may be placed at the same height on the basis of the substrate 101 and may be separated from each other. For example, they may all be at a vertical level that is the same vertical distance from the substrate (e.g., from a surface of the substrate), and may be horizontally separated from each other, with a gap therebetween that avoids electrical connection between the different uppermost metal wirings 121 to 125.

The power routing wiring body 131 includes a plurality of power routing wiring layers 131_L and a plurality of power routing wiring vias 131_VIA. The number of layers of the power routing wiring layers 131_L stacked in the third direction D3 may vary according to some embodiments, and the number of layers does not limit the technical idea of the present invention.

A power routing wiring body 131 is placed between the standard cell 102 and each power bump of the first and second VDD power bumps 111 and 113 and first and second VSS power bumps 112 and 114. According to one embodiment, the power routing wiring body 131 may be placed along the shortest route between the standard cell 102 and each of the first and second VDD power bump 111 and 113 and the first and second VSS power bumps 112 and 114. Further, the power routing wiring body 131 may be placed so as not to be disturbed by noise, short circuit or the like in signal transmission of the signal routing wiring body 132.

The signal routing wiring body 132 includes a plurality of signal routing wiring layers 132_L and a plurality of signal routing wiring vias 132_VIA. The number of layers of the routing wiring layer 132_L stacked in the third direction D3 may vary according to some embodiments, and the number of layers does not limit the technical idea of the present invention.

The signal routing wiring body 132 is placed between each signal bump 115 and the standard cell 102, and according to one embodiment, the signal routing wiring body 132 may be placed along the shortest route between each signal bump 115 and the standard cell 102.

The passivation layer 150 is placed on the first to fifth uppermost metal wirings 121 to 125, and one side of the passivation layer 150 may be included on the rear side 100b of the integrated circuit chip 100_1 and may form the rear surface of the integrated circuit chip 100_1.

Connection pads 151 may be formed in the passivation layer 150, and the passivation layer 150 may include or may be formed by, for example, an oxide film or a nitride film, but is not limited thereto.

The first to fifth uppermost metal wirings 121 to 125, and the bumps including the first and second VDD power bumps 111 and 113, the first and second VSS power bumps 112 and 114, the signal bumps 115 and the edge power bumps 119 may be electrically connected through the connection pads 151 placed in the passivation layer 150.

The first VDD power bump 111 is used to apply a positive operating voltage VDD to an integrated circuit which may include one or more transistors 103 of the standard cell 102, and the first VSS power bump 112 is used to apply a ground (electrical ground) operating voltage VSS to an integrated circuit which may include one or more transistors 103 of the standard cell 102. Accordingly, the first VDD power bump 111 and the first VSS power bump 112 may supply the power to the standard cell 102 through the first and second uppermost metal wirings 121 and 122 and the power routing wiring body 131.

Furthermore, the edge power bump 119 is placed on the first uppermost metal wiring 121, and the positive operating voltage VDD to be applied to the first VDD power bump 111 may also be applied to the edge power bump 119. The same positive operating voltage VDD may be applied to the power bump placed on the first uppermost metal wiring 121. The same ground operating voltage VSS may be applied to the power bump placed on the second uppermost metal wiring 122.

According to one embodiment, different positive operating voltages VDD may be applied to the first VDD power bump 111 and the second VDD power bump 113. Similarly, different ground operating voltages VSS may be applied to the first VSS power bump 112 and the second VSS power bump 114.

Figure 3:
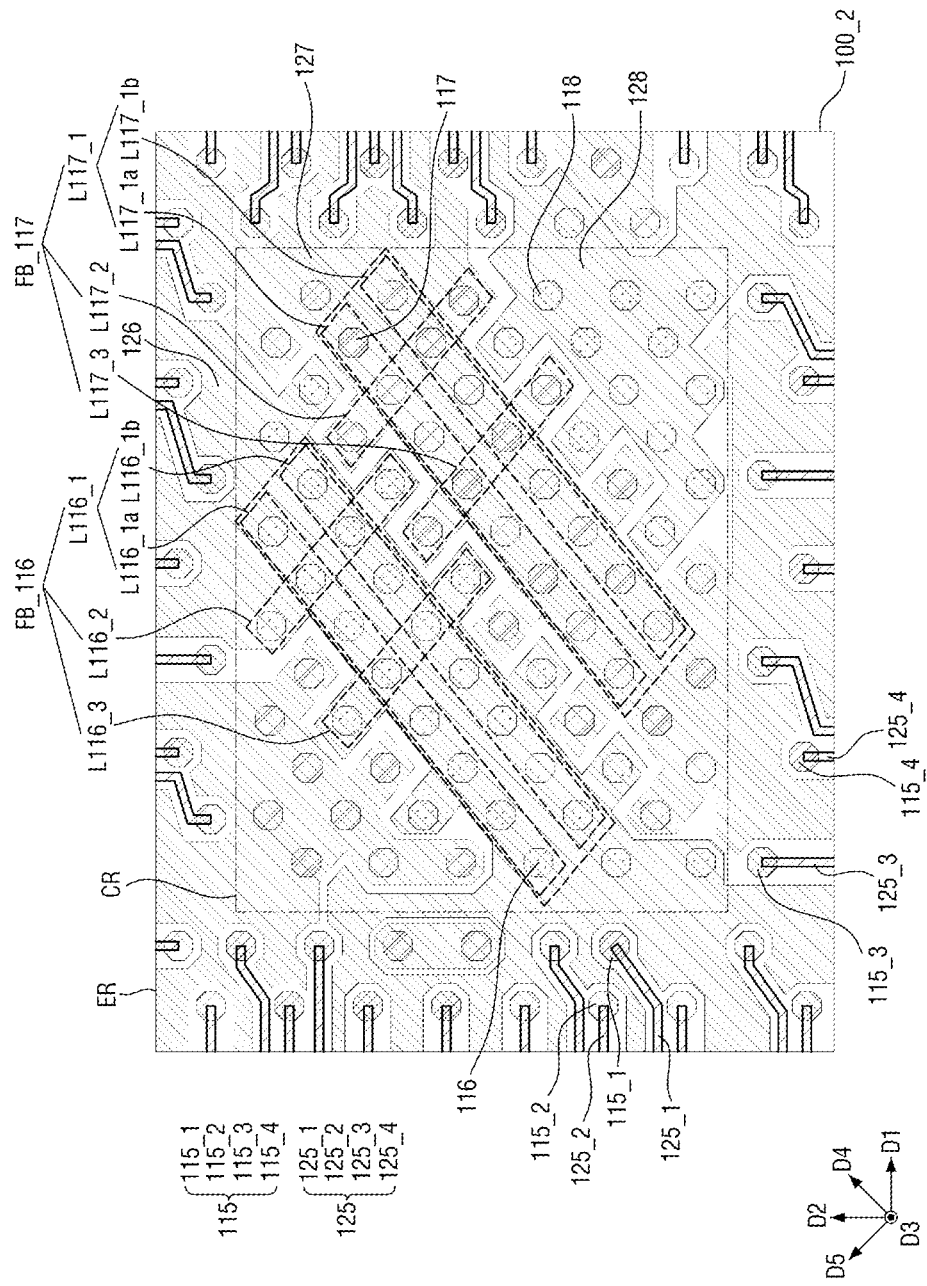
FIG. 3 is a plan view for explaining an integrated circuit chip according to some other embodiments of the present invention.

FIG. 3 is a plan view for explaining an integrated circuit chip according to some other embodiments of the present invention.

Hereinafter, an integrated circuit chip according to some other embodiments of the present invention will be explained with reference to FIG. 3. Differences from the integrated circuit chip 100_1 shown in FIGS. 1 and 2 will be mainly explained.

Referring to FIG. 3, first and second VDD power bumps 116 and 118 and first VSS power bumps 117 according to some embodiments may be placed in a staggered arrangement and may be placed in a staggered form on the central region CR.

The first VDD power bumps 116 may include a first line group L116_1 placed to extend in the first diagonal direction D4 of the integrated circuit chip 100_2, a second line group L116_2 placed to extend in the second diagonal direction D5 of the integrated circuit chip 100_1, and a third line group L116_3 placed to extend in the second diagonal direction D5 of the integrated circuit chip 100_1.

The first line group L116_1 includes a first a line group L116_1_a (also described as a first line sub-group) and a first b line group L116_1_b (also described as a first line additional subgroup), and the first a line group L116_1_a and the first b line group L116_1_b extend to be parallel to each other in the first diagonal direction D4 and are separated from each other.

The second line group L116_2 and the third line group L116_3 extend to be parallel to each other in the second diagonal direction D5, and at least one configuration of the first VDD power bumps 116 included in the first line group L116_1 may include first VDD power bumps 116 placed between the second line group L116_2 and the third line group L116_3. Accordingly, at least some of the first VDD power bumps 116 may include a first VDD fishbone group FB_116 placed in the form of a fishbone including the first line group L116_1 to the third line group L116_3.

The first VSS power bumps 117 may include a fourth line group L117_1 placed to extend in the first diagonal direction D4 of the integrated circuit chip 100_2, a fifth line group L117_2 placed to extend in the second diagonal direction D5 of the integrated circuit chip 100_1, and a sixth line group L117_3 placed to extend in the second diagonal direction D5 of the integrated circuit chip 100_1.

The fourth line group L117_1 includes a fourth_a line group L117_1a (also described as a fourth line sub-group) and a fourth b line group L117_1b (also described as a fourth line additional sub-group), and the fourth_a line group L117_1a and the fourth b line group L117_1b extend to be parallel to each other in the first diagonal direction D4 and are separated from each other.

The fifth line group L117_2 and the sixth line group L117_6 extend to be parallel to each other in the second diagonal direction D5, and at least one configuration of the first VSS power bumps 117 included in the fourth line group L117_1 may include first VSS power bumps 117 placed between the fifth line group L117_2 and the sixth line group L117_3. Accordingly, at least a part of the first VSS power bumps 117 may include a first VSS fishbone group FB_117 formed in the form of a fishbone including the fourth line group L117_1 to the sixth line group L117_3.

Figure 4:
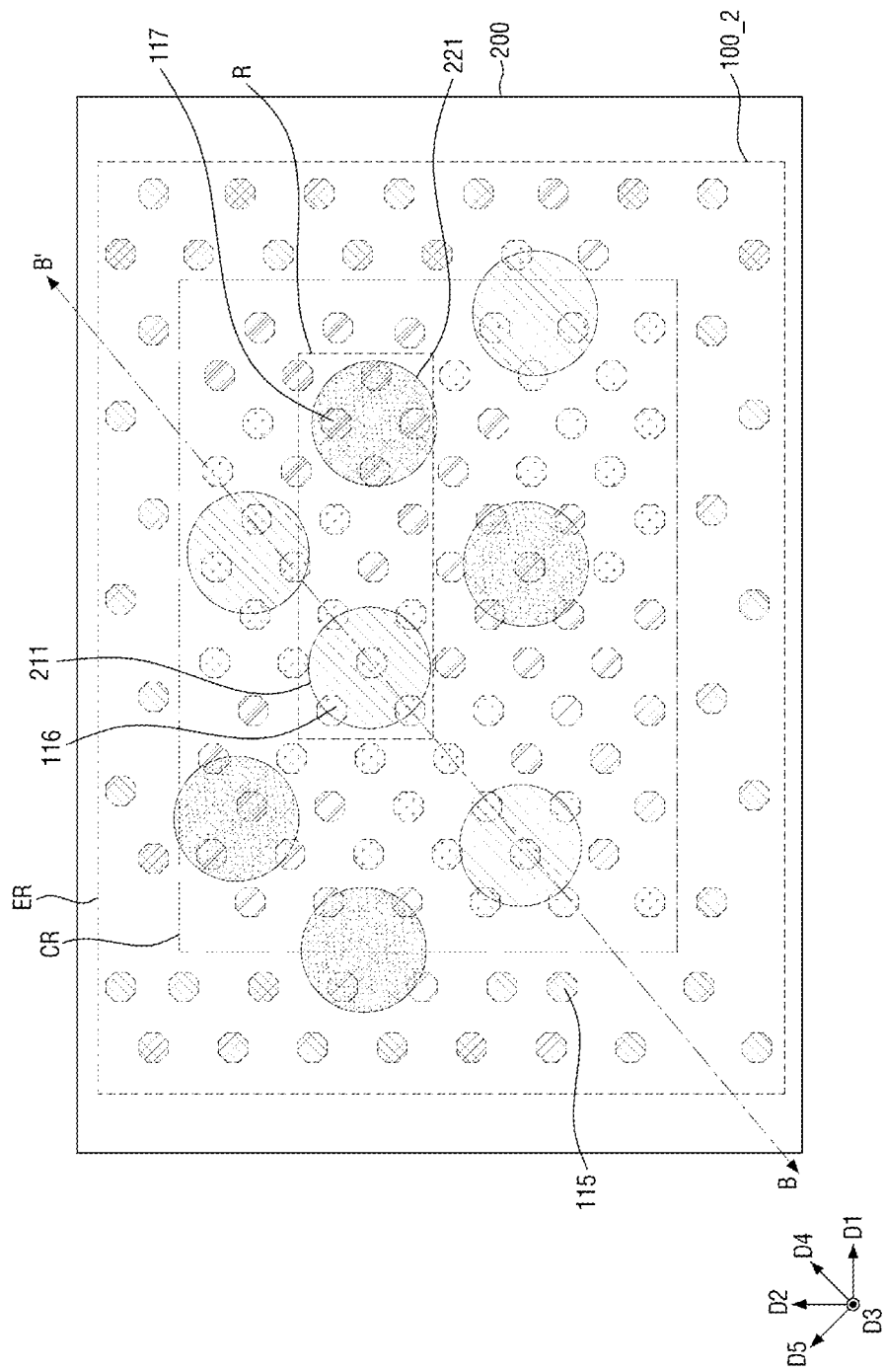
FIG. 4 is a plan view for explaining a semiconductor package including the integrated circuit chip of FIG. 3.
Figure 5:
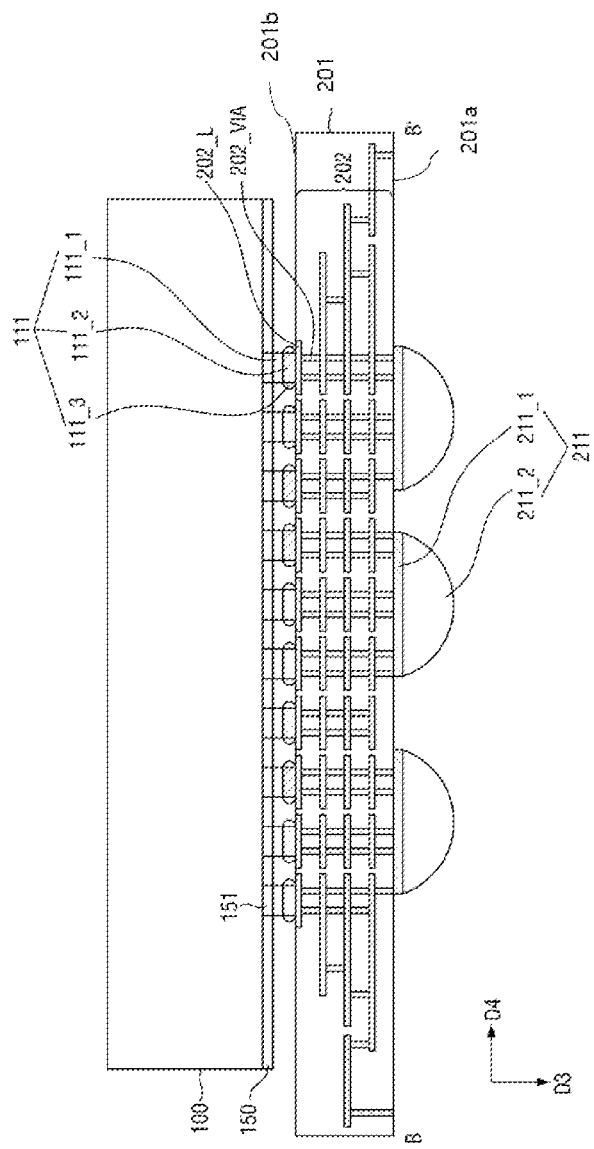
FIG. 5 is a cross-sectional view taken along a line B-B' of FIG. 4.
Figure 6:
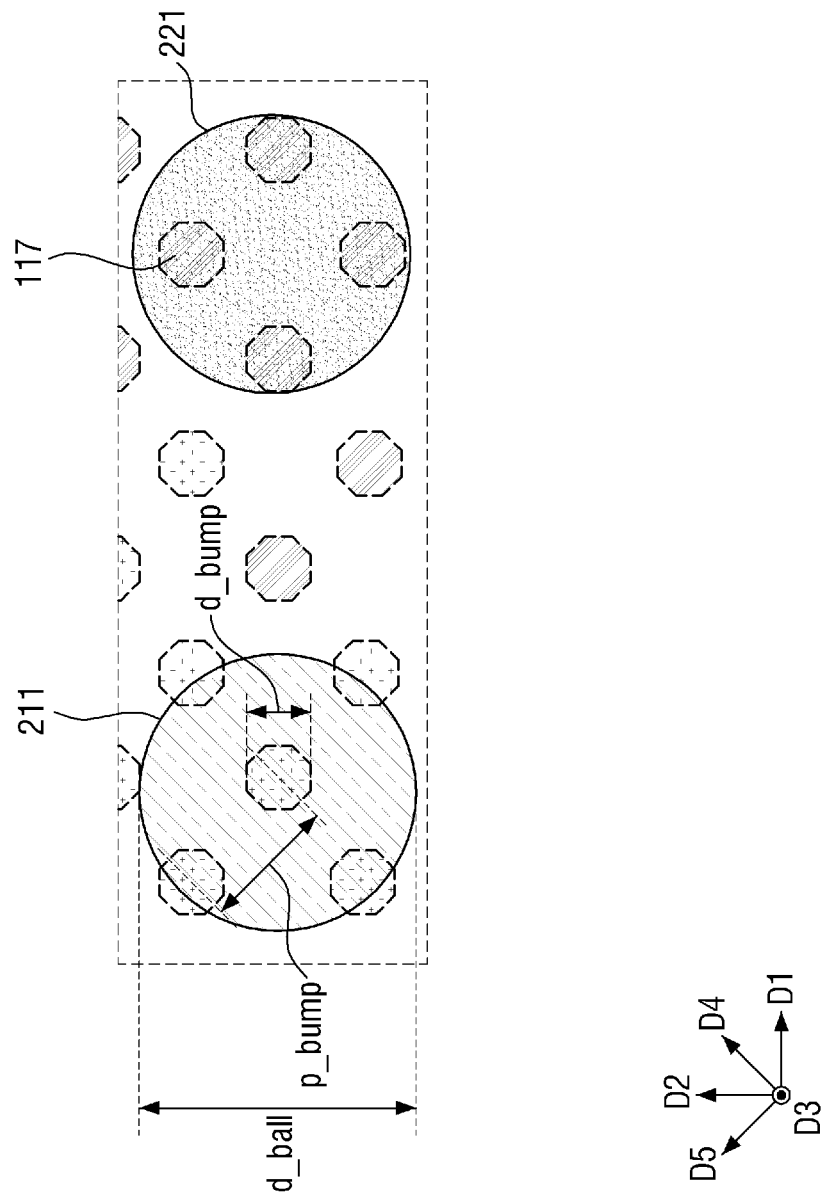
FIG. 6 is an enlarged view in which a region R of FIG. 4 is enlarged.

FIG. 4 is a plan view for explaining a semiconductor package including the integrated circuit chip of FIG. 3. FIG. 5 is a cross-sectional view taken along the line B-B' of FIG. 4. FIG. 6 is an enlarged view in which a region R of FIG. 4 is enlarged.

FIG. 4 is a plan view that shows a power bump and a signal bump placed on the rear side of the integrated circuit chip 100_2, and VDD external connection terminal 211 and a VSS external connection terminal 221 placed on the first side 201a of the package substrate 201 from the planar viewpoint. Though only one VDD external connection terminal 211 and one VSS external connection terminal 221 are labeled in FIG. 4 and described in detail below, as can be seen there are a plurality of each type of external connection terminal. These external connection terminals are for connecting the semiconductor package 200 to an external source, in order to apply voltages to the semiconductor package 200.

Referring to FIGS. 3 to 6, a semiconductor package 200 may include a package substrate 201 and an integrated circuit chip 100_2. Though not shown, the package may also include a molding layer, or encapsulation layer, covering a top surface of the package substrate 201 and at least side surfaces of the integrated circuit chip 100_2. The molding layer may also cover a top surface of the integrated circuit chip 100_2.

The package substrate 201 includes a first side 201a, or first surface, and a second side 202b, or second surface, opposite to each other, and may include a VDD external connection terminal 211, a VSS external connection terminal 221 and a redistribution structure 202.

In the semiconductor package 200 according to some embodiments, the VDD external connection terminal 211 and the VSS external connection terminal 221 may include an external connection pad and a solder ball, and the configurations of the VDD external connection terminal 211 and the VSS external connection terminal 221 may be the same as or correspond to each other. Thus, explanation of the VSS external connection terminal 221 may be replaced through the explanation of the VDD external connection terminal 211.

The VDD external connection terminal 211 may include a VDD solder ball 211_1 and a VDD external connection pad 211_2, and the VDD external connection pad 211_2 may include a material such as tin (Sn)-aluminum (Al)-copper (Cu). Although the VDD external connection terminal 211 is shown as a plurality of components (e.g., two components) including the VDD solder ball 211_1 and the VDD external connection pad 211_2 in the drawing, the VDD external connection terminal 211 may be a single integrated component (e.g., with no noticeable interface therein) or more than two components according to different embodiments.

The VDD external connection terminal 211 and the VSS external connection terminal 221 serve to physically and/or electrically connect the semiconductor package 200 to an external device such as a main board of electronic equipment.

In the semiconductor package 200 according to some embodiments, the VDD external connection terminal 211 and the VSS external connection terminal 221 may have a circular shape as shown in FIG. 4, or may have a shape such as a polygon without being limited thereto.

Considering that a ball diameter d ball of the VDD external connection terminal 211 and the VSS external connection terminal 221 is in the range of 0.2 mm to 0.6 mm, the bump diameter d_bump as described in FIG. 2 is in the range of 44 um to 96 um, and the bump pitch p_bump is in the range of 90 um to 180 um, in the semiconductor package 200, the VDD external connection terminal 211 and the VSS external connection terminal 221 may overlap the power bumps in the range of three to five from the planar viewpoint.

The VDD external connection terminals 211 and the VSS external connection terminals 221 are placed on the first side 201a, and in the semiconductor package 200 according to some embodiments, the VDD external connection terminals 211 and the VSS external connection terminals 221 may be placed in a staggered arrangement and may be placed in a staggered form.

In the semiconductor package 200 according to some embodiments, the VDD external connection terminals 211 are placed to extend in the first diagonal direction D4 along the first line group L116_1 of the first VDD power bump 116, and may overlap the first line group L116_1 from the plan view. The VSS external connection terminals 221 are placed to extend in the first diagonal direction D4 along the fourth line group L117_1 of the VSS power bumps 117 and may overlap the fourth line group L117_1 from the plan view.

Each VDD external connection terminal 211 may overlap three to five first VDD power bumps 116 included in the first line group L116_1 from the plan view, and does not overlap the VSS power bumps 117. According to one embodiment, the first VDD power bumps 116 overlapping one VDD external connection terminal 211 may be placed in a rhombus shape, that is, four first VDD power bumps 116 may be placed.

Each VSS external connection terminal 221 may overlap three to five first VSS power bumps 117 included in the fourth line group L117_1 from the plan view, and does not overlap the VSS power bumps 117. According to one embodiment, the first VSS power bumps 117 overlapping one VSS external connection terminal 221 may be placed in a rhombus shape, that is, four first VSS power bumps 117 may be placed.

A redistribution structure 202 according to the semiconductor package 200 according to some embodiments includes a plurality of redistribution lines 202_L and redistribution vias 202_VIA. Each set of redistribution lines 202_1 and adjacent redistribution vias 202_VIA may be included in a redistribution layer that also includes an insulating layer. The number of redistribution layers stacked in the third direction D3 may vary according to some embodiments, and the number of redistribution layers does not limit the technical idea of the present invention.

The redistribution structure 202 is placed between the external connection terminals (e.g., the VDD external connection terminals 211 and the VSS external connection terminal 221s), and the power bumps (e.g., the first VDD power bumps 116 and the first VSS power bumps 117). According to one embodiment, the portion of the redistribution structure 202 connecting each set of power bumps to a respective external connection terminal may be placed along the shortest route between the set of power bumps and the respective external connection terminal. So, a set of redistribution lines 202_L and redistribution vias 202_VIA that connect between a single VDD external connection terminal 211 and a first group of 3-5 VDD power bumps 116 may be formed to have the shortest route (e.g., a straight line in a vertical direction) to connect each power bump to the external connection terminal. The same applies to the VSS power bumps 117 and respective external connection terminals.

Therefore, when the first VDD power bumps 116 overlapping the single VDD external connection terminal 211 in the semiconductor package 200 according to some embodiments is placed in a diamond shape, four or more redistribution structures 202 may be connected to the single VDD external connection terminal 211 to overlap in the plan view.

Figure 7:
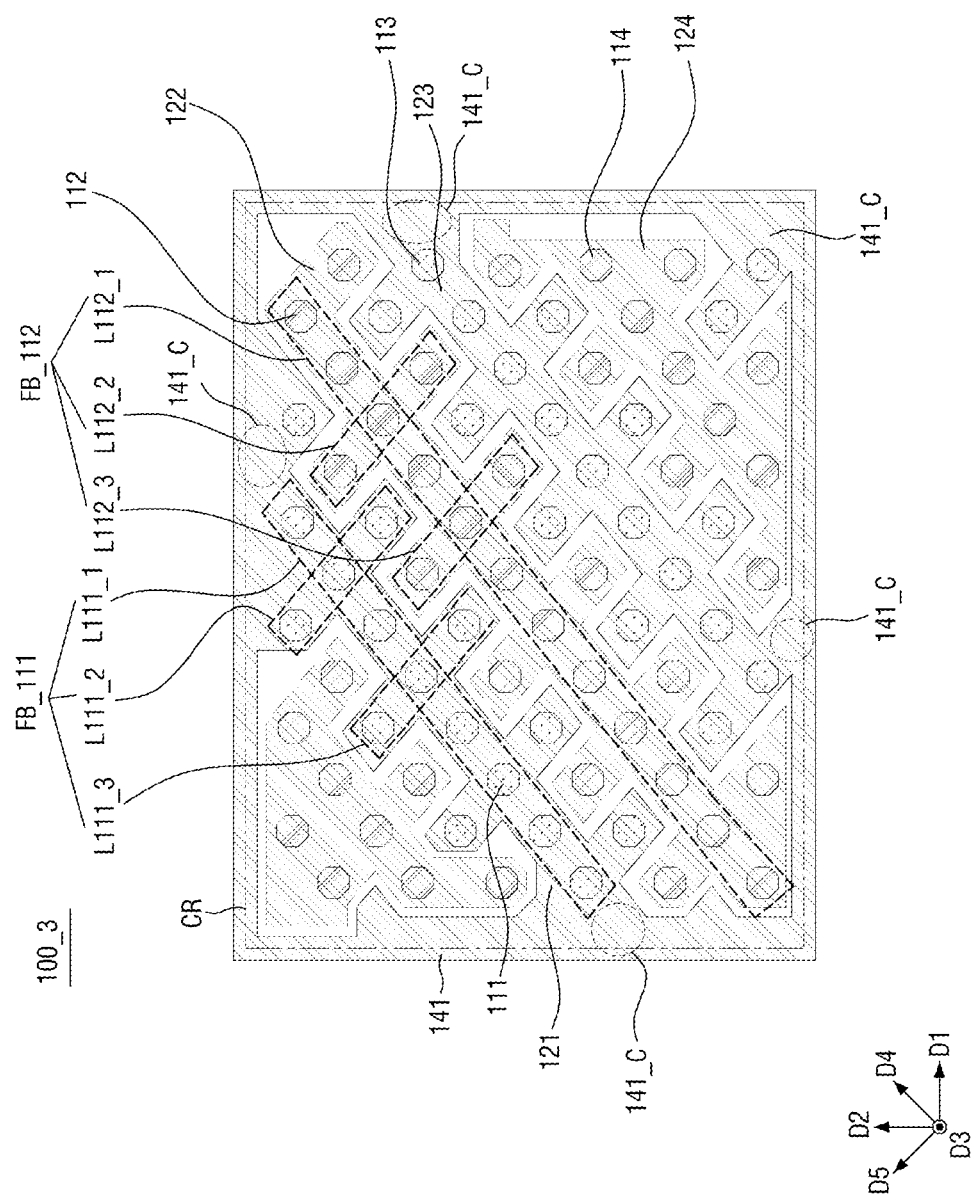
FIG. 7 is a plan view for explaining an integrated circuit chip according to some other embodiments of the present invention.

FIG. 7 is a plan view for explaining an integrated circuit chip according to some other embodiments of the present invention.

Hereinafter, an integrated circuit chip according to some other embodiments of the present invention will be explained with reference to FIG. 7. Differences from the integrated circuit chip 100_1 shown in FIGS. 1 and 2 will be mainly explained.

FIG. 7 is a plan view showing the power bumps and the uppermost metal wirings placed below the power bumps and electrically connected in a central region CR of an integrated circuit chip 100_3 and a region adjacent to the central region CR. Referring to FIG. 7, the integrated circuit chip 100_3 includes a first ring metal wiring 141 placed along an edge portion of the central region CR.

Within the first ring metal wiring 141 according to some embodiments, the first to fifth uppermost metal wirings 121 to 125 may be placed at the same height with respect to a surface of the substrate 101.

The first ring metal wiring 141 is connected to the first and third uppermost metal wirings 121 and 123 through a first ring connection part 141_C, and may be separated from the second and fourth uppermost metal wirings 122 and 124.

The first and second VDD power bumps 111 and 113 may be electrically connected through the first and third uppermost metal wirings 121 and 123 and the first ring metal wiring 141. According to the embodiment, the same positive operating voltage VDD may be applied to the first and second VDD power bumps 111 and 113.

Figure 8:
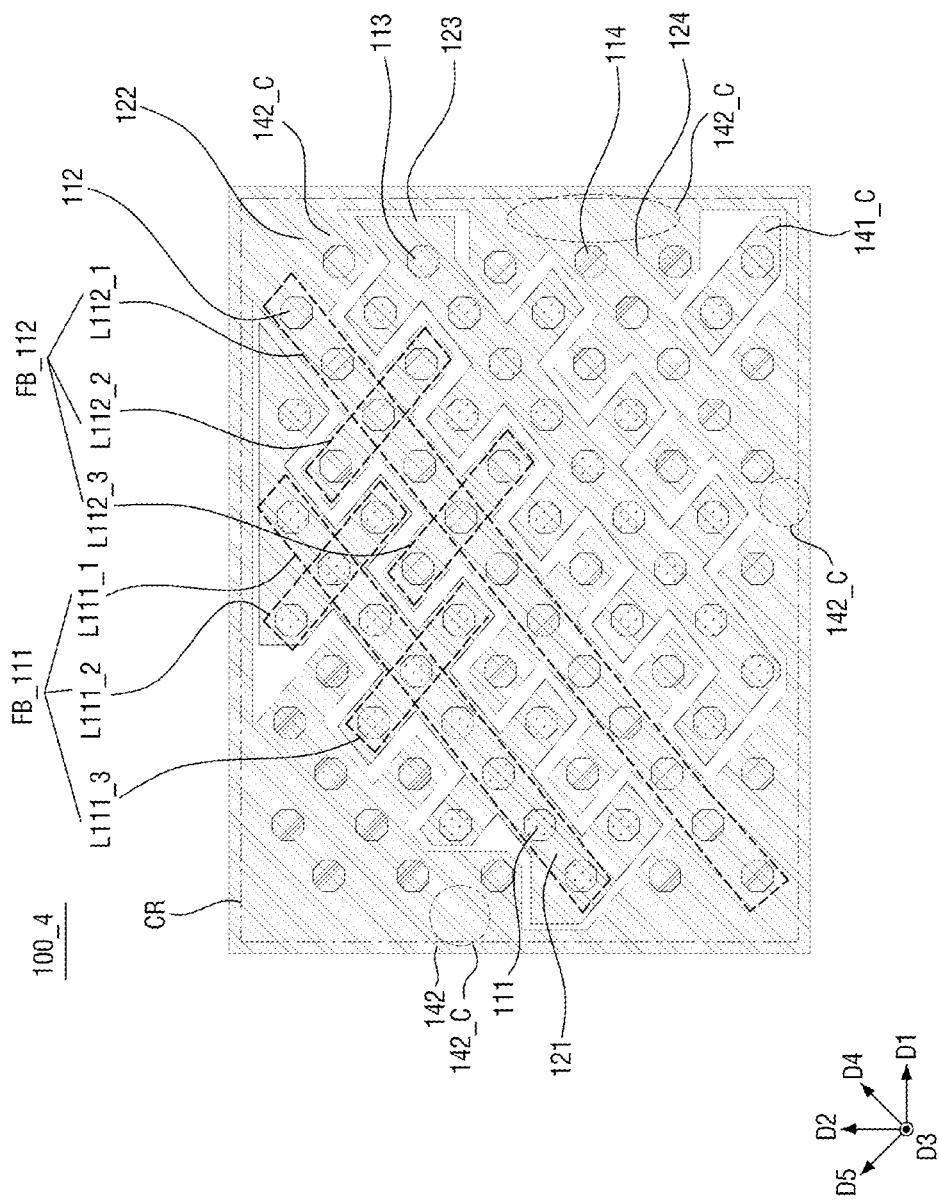
FIG. 8 is a plan view for explaining an integrated circuit chip according to some other embodiments of the present invention.

FIG. 8 is a plan view for explaining an integrated circuit chip according to some other embodiments of the present invention.

Hereinafter, an integrated circuit chip according to some other embodiments of the present invention will be explained with reference to FIG. 8. Differences from the integrated circuit chip 100_1 shown in FIGS. 1 and 2 will be mainly explained.

FIG. 8 is a plan view showing the power bumps and the uppermost metal wirings placed below the power bumps and electrically connected in a central region CR of an integrated circuit chip 100_4 and a region adjacent to the central region CR. Referring to FIG. 8, the integrated circuit chip 100_4 includes a second ring metal wiring 142 placed along the edge portion of the central region CR.

Within a second ring metal wiring 142 according to some embodiments, the first to fifth uppermost metal wirings 121 to 125 may be placed at the same height with respect to a surface of the substrate 101.

The second ring metal wiring 142 is connected to the second and fourth uppermost metal wirings 122 and 124 through a second ring connection part 142_C, and may be separated from the first and third uppermost metal wirings 121 and 123.

The first and second VSS power bumps 112 and 114 may be electrically connected through the second and fourth uppermost metal wirings 122 and 124 and the second ring metal wiring 142. According to the embodiment, the same ground operating voltage VSS may be applied to the first and second VSS power bumps 112 and 114.

Figure 9:
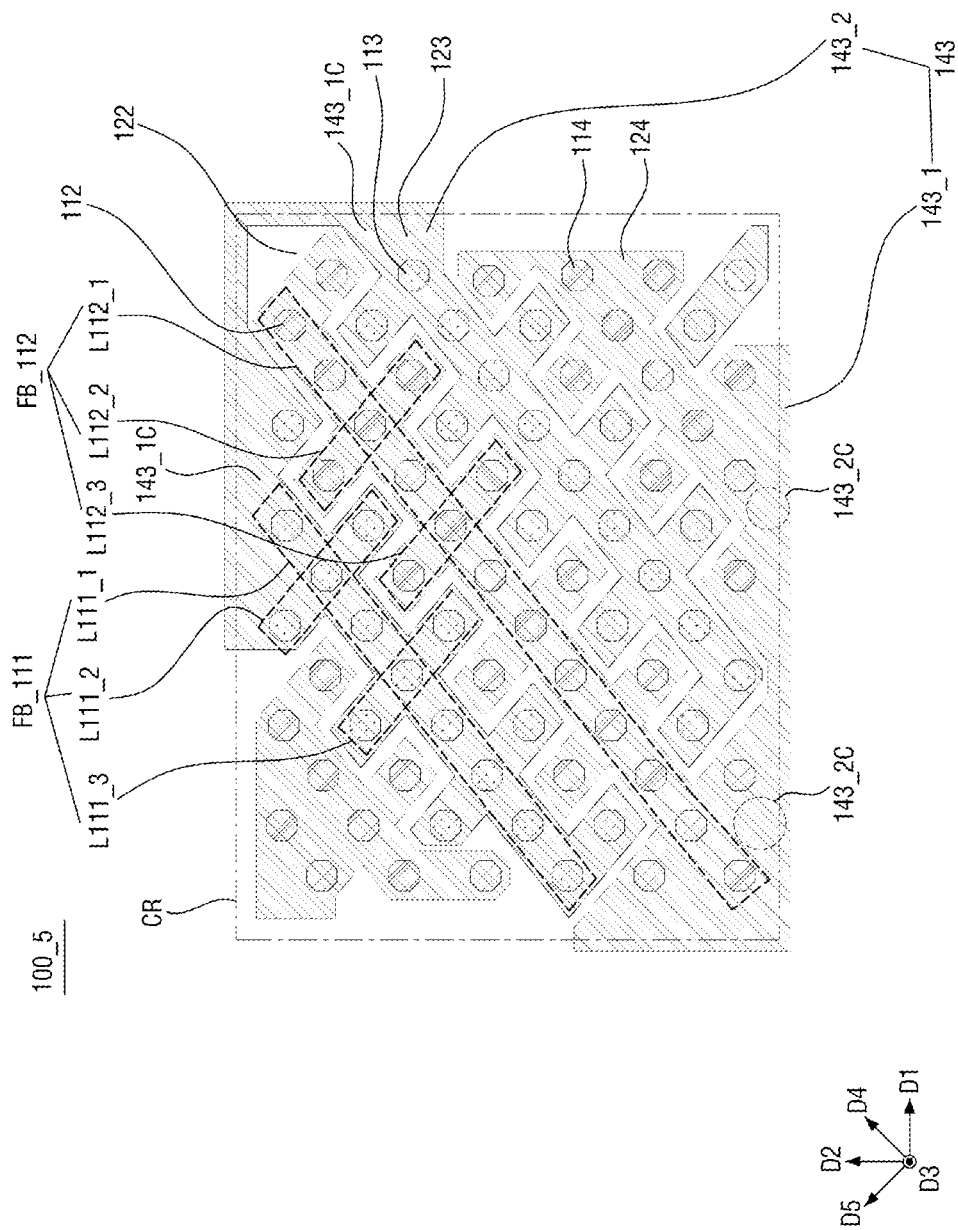
FIG. 9 is a plan view for explaining an integrated circuit chip according to some other embodiments of the present invention.

FIG. 9 is a plan view for explaining an integrated circuit chip according to some other embodiments of the present invention.

Hereinafter, an integrated circuit chip according to some other embodiments of the present invention will be explained with reference to FIG. 9. Differences from the integrated circuit chip 100_1 shown in FIGS. 1 and 2 will be mainly explained.

FIG. 9 is a plan view showing the power bumps and the uppermost metal wirings placed below the power bumps and electrically connected in a central region CR of an integrated circuit chip 100_5 and a region adjacent to the central region CR. Referring to FIG. 9, the integrated circuit chip 100_5 includes an outer metal wiring 143 placed along the edge portion of the central region CR.

Between portions of the outer metal wiring 143 according to some embodiments, the first to fifth uppermost metal wirings 121 to 125 may be placed at the same height with respect to a surface of the substrate 101.

The outer metal wiring 143 may include first outer metal wiring portion 143_1 and a second outer metal wiring portion 143_2.

The first outer metal wiring portion 143_1 may be connected to the first and third uppermost metal wirings 121 and 123 through the first outer connection part 143_1C, and the second outer metal wiring portion 143_2 may be connected to the second and fourth uppermost metal wirings 122 and 124 through the second outer connection part 143_2C.

The first and second VDD power bumps 111 and 113 may be electrically connected through the first and third uppermost metal wirings 121 and 123 and the first outer metal wiring portion 143_1. According to this embodiment, the same positive operating voltage VDD may be applied to the first and second VDD power bumps 111 and 113.

The first and second VSS power bumps 112 and 114 may be electrically connected through the second and fourth uppermost metal wirings 122 and 124 and the second outer metal wiring portion 143_2. According to the embodiment, the same ground operating voltage VSS may be applied to the first and second VSS power bumps 112 and 114.

Figure 10:
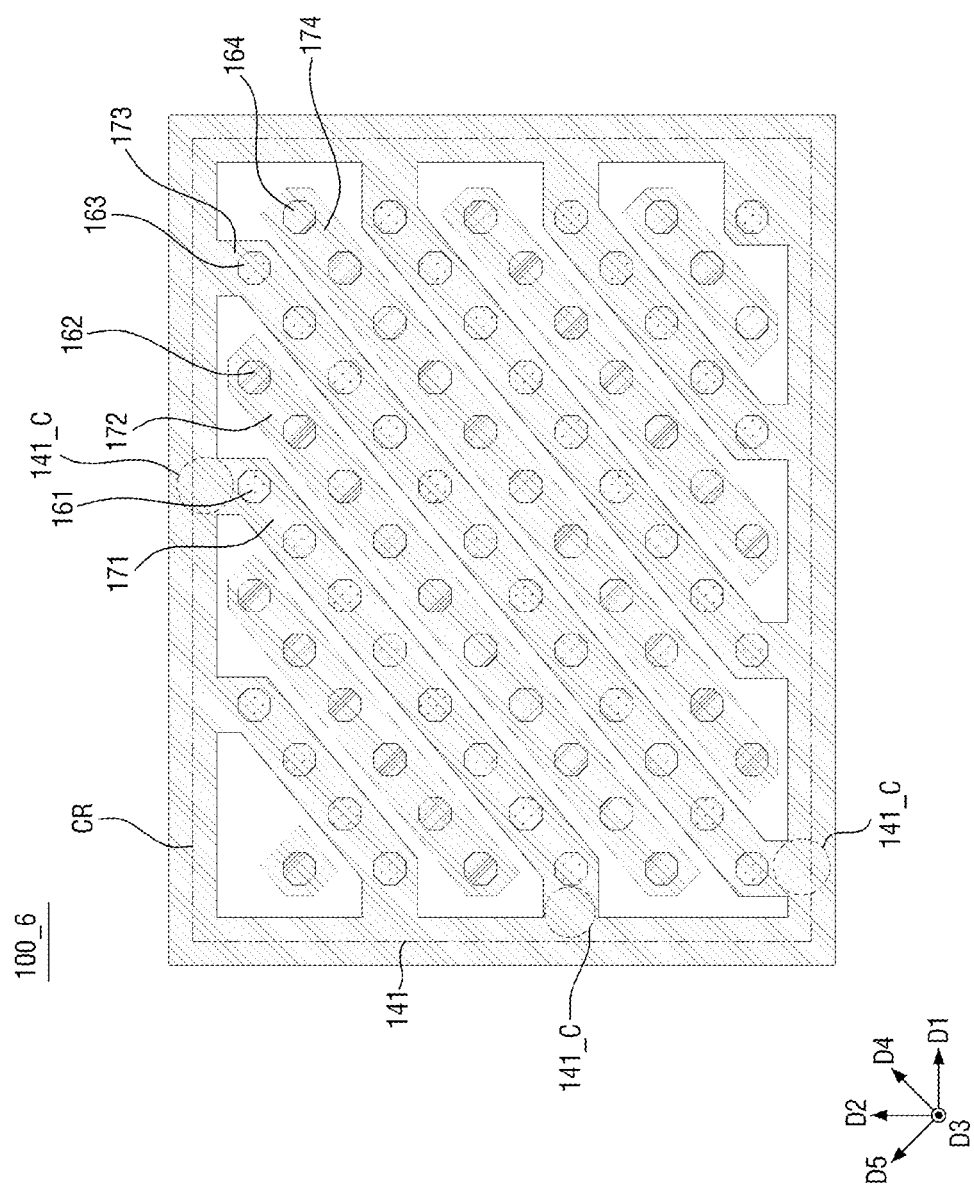
FIG. 10 is a plan view for explaining an integrated circuit chip according to some other embodiments of the present invention.

FIG. 10 is a plan view for explaining an integrated circuit chip according to some other embodiments of the present invention.

Hereinafter, an integrated circuit chip according to some other embodiments of the present invention will be explained with reference to FIG. 10. Differences from the integrated circuit chip 100_3 shown in FIG. 7 will be mainly explained.

FIG. 10 is a plan view showing the power bumps and the uppermost metal wirings placed below the power bumps and electrically connected in a central region CR of an integrated circuit chip 100_6 and a region adjacent to the central region CR.

First and second VDD power bumps 161 and 163 and first and second VSS power bumps 162 and 164 may be placed on the central region CR of the integrated circuit chip 100_6 in a staggered arrangement and may be placed in a staggered form.

The plurality of first VDD power bumps 161 and the plurality of second VDD power bumps 163 include portions which are placed while extending in parallel in the first diagonal direction D4. For example, only portions placed to extend diagonally in one direction rather than diagonally in multiple directions are included in the plurality of first VDD power bumps 161 and the plurality of second VDD power bumps 163.

First VSS power bumps 162 may be placed between the first VDD power bumps 161 and the second VDD power bumps 163. For example, a group of first VSS power bumps 162 may be between a group of first VDD power bumps 161 and a group of second VDD power bumps 163.

The plurality of first VSS power bumps 162 and the plurality of second VSS power bumps 164 include portions which are placed while extending in parallel in the first diagonal direction D4. For example, only portions placed to extend diagonally in one direction rather than diagonally in multiple directions are included in the plurality of first VDD power bumps 161 and the plurality of second VDD power bumps 163.

Second VDD power bumps 163 may be placed between a plurality of first VSS power bumps 162 and a plurality of second VSS power bumps 164. For example, a group of second VDD power bumps 163 may be between a group of first VSS power bumps 162 and a group of second VSS power bumps 164.

FIG. 11 is a plan view for explaining an integrated circuit chip according to some other embodiments of the present invention.

Hereinafter, an integrated circuit chip according to some other embodiments of the present invention will be explained with reference to FIG. 11. Differences from the integrated circuit chip 100_4 shown in FIG. 8 will be mainly explained.

FIG. 11 is a plan view showing the power bumps and the uppermost metal wirings placed below the power bumps and electrically connected in a central region CR of an integrated circuit chip 100_7 and a region adjacent to the central region CR.

The first and second VDD power bumps 161 and 163 and the first and second VSS power bumps 162 and 164 may be placed on the central region CR of the integrated circuit chip 100_7 in a staggered arrangement and may be placed in a staggered form.

The plurality of first VDD power bumps 161 and the plurality of second VDD power bumps 163 include portions which are placed while extending in parallel in the first diagonal direction D4. For example, only portions placed to extend diagonally in one direction rather than diagonally in multiple directions are included in the plurality of first VDD power bumps 161 and the plurality of second VDD power bumps 163.

First VSS power bumps 162 may be placed between first VDD power bumps 161 and second VDD power bumps 163.

The plurality of first VSS power bumps 162 and the plurality of second VSS power bumps 164 include portions which are placed while extending in parallel in the first diagonal direction D4. For example, only portions placed to extend diagonally in one direction rather than diagonally in multiple directions are included in the plurality of first VSS power bumps 162 and the plurality of second VSS power bumps 164.

Second VDD power bumps 163 may be placed between a plurality of first VSS power bumps 162 and a plurality of second VSS power bumps 164.

In the integrated circuit chips 100_1 to 100_5 according to some embodiments, the number of power bumps connected to the uppermost metal wiring 121 and 122 placed below the power bumps is increased through the arrangement of the power bumps 111 and 112 of the fishbone form. Thus, compared to a VDD drop in the case of the VDD power bumps 111, it is possible to improve a VSS bounce and improve the power integrity in the case of the VSS power bumps 112.

In the integrated circuit chips 100_1 to 100_5 according to some embodiments, the number of power routing wiring bodies 131 placed to ben parallel between one uppermost metal wiring 121 and 122 placed below the power bumps 111 and 112 and the standard cell 102 through the arrangement of the power bumps 111 and 112 of the fishbone, or football lacing form. Thus, it is possible to improve IR-drop and improve the power intensity.

In the integrated circuit chips 100_3 to 100_7 according to some embodiments, the ring metal wirings 141 to 143 are placed along the edge portion of the central region on the lower side of the integrated circuit chip, the separated uppermost metal wirings (121 and 123, 122 and 124, 171 and 173, 172, and 174) are connected, and the number of power routing wiring bodies 131 placed to be parallel between the uppermost metal wirings 121 to 124 and 171 to 174 and the standard cell 102 is increased. Thus, it is possible to improve the IR-drop and improve the power intensity.

In the semiconductor package 200 including the integrated circuit chip 100_2 according to some embodiments, the number of power bumps 116 and 117 overlapping is increased, while the same operating voltage as the external connection terminals 211 and 221 placed on the package substrate is applied, through the arrangement of the power bumps of the fishbone or football lattice form, and the number of redistribution structures 202 connected in parallel between the uppermost metal wirings 126 and 127 and the external connection terminals 211 and 221. Accordingly, it is possible to improve IR-drop and improve power integrity.

However, the effects of the embodiments are not restricted to the ones set forth herein. The above and other effects of the embodiments will become more apparent to one of daily skill in the art to which the present disclosure pertains by referencing the claims.

What is claimed is:

1. An integrated circuit chip which includes a substrate on which a standard cell is disposed, the integrated circuit chip comprising:

a plurality of power bumps including a plurality of first power bumps and a plurality of second power bumps, the plurality of power bumps disposed to have a staggered arrangement in a central region of one surface of the integrated circuit chip, and connected to provide power to the standard cell;

a first metal wiring disposed below the plurality of first power bumps and electrically connected to the plurality of first power bumps, at least a part of the first metal wiring overlapping the plurality of first power bumps from a plan view; and a second metal wiring horizontally separated from the first metal wiring, disposed below the plurality of second power bumps, and electrically connected to the plurality of second power bumps, at least a part of the second metal wiring overlapping the plurality of second power bumps from the plan view, wherein the plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip, wherein the plurality of second power bumps are disposed along a third line spaced apart from the first line and extending in the first direction, and along a fourth line spaced apart from the second line and extending in the second direction, wherein at least one first power bump of the plurality of first power bumps and at least one second power bump of the plurality of second power bumps are arranged along the second line, and at least another first power bump of the plurality of first power bumps and at least another second power bump of the plurality of second power bumps are arranged along the fourth line.

2. The integrated circuit chip of claim 1, wherein the plurality of first power bumps are connected to an integrated circuit within the integrated circuit chip, which integrated circuit is configured to operate by receiving a VDD voltage from the plurality of first power bumps, and the plurality of second power bumps are connected to an integrated circuit within the integrated circuit chip, which integrated circuit is configured to operate by receiving a VSS voltage from the plurality of second power bumps.

3. The integrated circuit chip of claim 1, wherein the plurality of first power bumps include a first line group disposed along the first line.

4. The integrated circuit chip of claim 3, wherein the plurality of first power bumps include an additional line group spaced apart from the first line group and disposed along a line parallel to the first line.

5. The integrated circuit chip of claim 3, wherein the plurality of first power bumps include a second line group arranged along the second line, and a third line group which is arranged along a fifth line spaced apart from the second line in the first direction and extending along the second direction, and the plurality of second power bumps include a fourth line group arranged along the fourth line, and a fifth line group which is arranged along a sixth line spaced apart from the fourth line in the first direction and extending along the second direction.

6. The integrated circuit chip of claim 1, further comprising:

a ring metal wiring formed to surround, in a plan view, a central region, and disposed adjacent to a first surface of the integrated circuit chip;

a plurality of third power bumps disposed in a staggered arrangement together with the plurality of first power bumps and the plurality of second power bumps, in the central region of the first surface of the integrated circuit chip; and a third metal wiring which is separated from the second metal wiring, is disposed to overlap the plurality of third power bumps from the plan view, and is electrically connected to the plurality of third power bumps, wherein the first metal wiring and the third metal wiring are connected to each other through the ring metal wiring, and the first power bumps and the third power bumps are electrically connected to each other.

7. The integrated circuit chip of claim 6, wherein the first to third metal wirings and the ring metal wiring are disposed at the same height with respect to a surface of the substrate.

8. The integrated circuit chip of claim 1, further comprising:

a first signal bump and a second signal bump which are disposed on one surface of the integrated circuit chip in an edge region other than the central region and provide an operating signal to the standard cell; and a third metal wiring and a fourth metal wiring which are each disposed below the first signal bump and the second signal bump respectively and are respectively electrically connected to the first signal bump and the second signal bump, and which are formed adjacent to the edge region of the integrated circuit chip, wherein the first metal wiring extends toward the edge region between the third metal wiring and the fourth metal wiring.

9. The integrated circuit chip of claim 8, wherein the first metal wiring, the third metal wiring and the fourth metal wiring are disposed at the same height with respect to a surface of the substrate, and the first metal wiring, the third metal wiring and the fourth metal wiring are horizontally separated from each other.

10. An integrated circuit chip which includes a substrate on which a standard cell is disposed, the integrated circuit chip comprising:

a plurality of power bumps including a plurality of first power bumps and a plurality of second power bumps, the plurality of power bumps disposed in a central region of one surface of the integrated circuit chip to have a staggered arrangement, and connected to provide power to the standard cell, wherein the plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip, wherein the plurality of second power bumps are disposed along a third line spaced apart from the first line and extending in the first direction, and along a fourth line spaced apart from the second line and extending in the second direction, wherein at least one first power bump of the plurality of first power bumps and at least one second power bump of the plurality of second power bumps are arranged along the second line, and at least another first power bump of the plurality of first power bumps and at least another second power bump of the plurality of second power bumps are arranged along the fourth line, and wherein the plurality of first power bumps are connected to an integrated circuit of the integrated circuit chip, and are configured such that when a first voltage is received from outside the integrated circuit chip through the plurality of first power bumps, the first voltage is applied to the integrated circuit through the plurality of first power bumps, and the plurality of second power bumps are connected to the integrated circuit of the integrated circuit chip, so and are configured such that when a second voltage different from the first voltage is received from outside the integrated circuit chip through the plurality of second power bumps, the second voltage is applied to the integrated circuit through the plurality of second power bumps.

11. The integrated circuit chip of claim 10, further comprising:

a first metal wiring disposed below the plurality of first power bumps and electrically connected to the plurality of first power bumps, at least a part of the first metal wiring overlapping each power bump of the plurality of first power bumps from a plan view; and a second metal wiring horizontally separated from the first metal wiring, disposed below the plurality of second power bumps, and electrically connected to the plurality of second power bumps, at least a part of the second metal wiring overlapping each power bump of the plurality of second power bumps from the plan view.

12. The integrated circuit chip of claim 11, wherein the first metal wiring and the second metal wiring are disposed at the same height with respect to a surface of the substrate.

13. The integrated circuit chip of claim 10, wherein the plurality of first power bumps are connected to circuit components of the integrated circuit chip that operate by receiving a VDD voltage as the first voltage, and the plurality of second power bumps are connected to circuit components of the integrated circuit chip that operate by receiving a VSS voltage as the second voltage.

14. The integrated circuit chip of claim 10, further comprising:

a ring metal wiring formed along an edge portion of the central region and adjacent to one surface of the integrated circuit chip; and a plurality of third power bumps disposed in the central region at one surface of the integrated circuit chip in a staggered arrangement together with the plurality of first power bumps and the plurality of second power bumps, wherein the plurality of first power bumps and the plurality of third power bumps are electrically connected through the ring metal wiring, and the plurality of third power bumps are connected to circuit components of the integrated circuit chip that operate by receiving the first voltage.

15. A semiconductor package comprising:

a package substrate including a first surface on which a plurality of external connection terminals are disposed, and a second surface opposite to the first surface; and an integrated circuit chip including a connection surface facing to the second surface of the package substrate, and including plurality of power bumps including a plurality of first power bumps and a plurality of second power bumps, the plurality of power bumps disposed on the connection surface to have a staggered arrangement, wherein the plurality of first power bumps are disposed along a first line extending in a first direction parallel to a first diagonal direction of the integrated circuit chip, and along a second line extending in a second direction parallel to a second diagonal direction of the integrated circuit chip different from the first diagonal direction, the first diagonal direction and second diagonal direction being diagonal with respect to edges of the integrated circuit chip, wherein the plurality of second power bumps are disposed along a third line different from the first line and extending in the first direction, and along a fourth line different from the second line and extending in the second direction, and wherein at least a first external connection terminal of the plurality of external connection terminals overlaps a set of power bumps of the plurality of first power bumps and does not overlap any power bumps of the plurality of second power bumps from a plan view.

16. The semiconductor package of claim 15, wherein the plurality of first power bumps include a first line group arranged along the first line, and a first line additional group which is spaced apart from the first line group and is arranged parallel to the first line.

17. The semiconductor package of claim 16, wherein the set of power bumps of the plurality of first power bumps that overlaps the first external connection terminal in a plan view includes power bumps arranged in a rhombus shape.

18. The semiconductor package of claim 16, wherein the first external connection terminal overlaps the set of the plurality of first power bumps in a plan view, wherein the set of the plurality of first power bumps includes three to five power bumps.

19. The semiconductor package of claim 15, wherein the plurality of first power bumps are connected to circuit components of the integrated circuit chip that operate by receiving a VDD voltage, and the second power bumps are connected to circuit components of the integrated circuit chip that operate by receiving a VSS voltage.

20. The semiconductor package of claim 15, wherein the plurality of first power bumps are connected to circuit components of the integrated circuit chip that operate by receiving a VSS voltage, and the second power bumps are connected to circuit components of the integrated circuit chip that operate by receiving a VSS voltage.

* * * * *